United States Patent [19]
Saito

[11] Patent Number: 5,981,362
[45] Date of Patent: Nov. 9, 1999

[54] MANUFACTURING METHOD OF WIRING

[75] Inventor: Satoshi Saito, Fukuyama, Japan

[73] Assignee: Sharp Kabushiki Kaisha, Osaka, Japan

[21] Appl. No.: 08/725,662

[22] Filed: Oct. 1, 1996

[30]  Foreign Application Priority Data

Feb. 26, 1996 [JP]  Japan ................................. 8-037756

[51] Int. Cl.⁶ ............................. C30B 33/00; H01L 21/20
[52] U.S. Cl. ...................................... 438/488; 438/502
[58] Field of Search ................................. 437/245, 190,
437/192, 193; 438/153, 164, 412, 481,
488, 510, 502

[56]  References Cited

U.S. PATENT DOCUMENTS

| | | | |
|---|---|---|---|
| 4,448,632 | 5/1984 | Akasaka | 156/603 |
| 5,173,446 | 12/1992 | Asakawa et al. | 437/111 |
| 5,466,638 | 11/1995 | Eguchi | 437/193 |
| 5,629,236 | 5/1997 | Wada et al. | 437/607 |

FOREIGN PATENT DOCUMENTS 04044229A  2/1992  Japan .
04247625A  9/1992  Japan .

*Primary Examiner*—Chandra Chaudhari
*Assistant Examiner*—Reneé R. Berry
*Attorney, Agent, or Firm*—Nixon & Vanderhye P.C.

[57]  ABSTRACT

An insulating film is formed on a surface of a semiconductor substrate. Then a photoresist pattern including only one wedge-like area is formed on a surface of the insulating film. Next, a groove part is formed in the insulating film, using the photoresist pattern as a mask. Next, a titanium layer and a polycrystal-structured aluminum layer are embedded in the entire groove part. A monocrystal-structured aluminum layer is formed by heating the polycrystal-structured aluminum layer at 500 to 600° C. and then cooling it down gradually. No monocrystal silicon to serve as a seed is needed in a bed. Therefore, for example, monocrystallization can be carried out even in second and third layers of multilayer wiring. This realizes a manufacturing method of wiring composed of a highly reliable monocrystal conductive film, which is widely applicable and especially appropriate to wiring of a semiconductor device.

14 Claims, 4 Drawing Sheets

MANUFACTURING METHOD OF WIRING

FIELD OF THE INVENTION

The present invention relates to a manufacturing method of wiring used suitably with, for example, a semiconductor device, and in particular to a highly reliable manufacturing method of wiring made of a monocrystal conductive film.

BACKGROUND OF THE INVENTION

Conventionally, aluminum (Al) and aluminum alloy has been typically used as a wiring material for semiconductor device manufacture. Besides, copper (Cu) is being studied for use as a wiring material because of its low resistance. These films are formed with sputtering method or chemical vapor deposition (CVD) method, and basically the wiring formed with these methods has a polycrystal structure.

If a large amount of electric current flows through this polycrystal-structured wiring for a long time in response to an action of an IC, momentum of electrons is given to atoms of the wiring material (e.g., aluminum atoms), and therefore the atoms are moved. These phenomena are called electromigration. After the atoms are moved, a void occurs in the wiring, and, in an extreme case, the wiring is cut off.

If an external tensile stress is applied to the polycrystal-structured wiring, the atoms of the wiring material (e.g., aluminum atoms) are moved in the same manner as above, which causes, for example, a void to occur in the wiring and the wiring to be cut off. These phenomena are called stress migration. All the phenomena described so far are known to occur in a crystal grain boundary where activation energy is the lowest to move the polycrystal-structured wiring material. For example, in the aluminum wiring, the phenomena are known to occur in a crystal grain boundary where activation energy is 0.5 eV. For example, in a case of the aluminum wiring, 0.2 to a few % of impurity such as copper, palladium and/or titanium are/is mixed to restrain dispersion of the aluminum in that crystal grain boundary.

However, this is still not capable enough to cope with an increasing electric current density in high speed devices of submicron rule. Therefore, more reliable wiring is in demand.

With such a demand in scope, monocrystallization of wiring of, for example, aluminum has been attempted lately. If monocrystallization completely eliminates the crystal grain boundary, a higher activation energy is required for the movement causing the electromigration and stress migration phenomena, thereby improving reliability of the wiring. For example, in a case of aluminum, the monocrystallization almost triples the activation energy required for the movement, up to about 1.4 eV.

However, it is very difficult to conduct such monocrystallization with an entire wafer surface. A monocrystallization method currently in study is disclosed in Japanese Laid-Open Patent Application No. 4-44229/1992 (Tokukaihei 4-44229). According to the method, first, aluminum formed with sputtering method on a barrier metal receives patterning and is coated with a plasma $SiO_2$ film. Then, the plasma $SiO_2$ film on the aluminum is removed with etchback to expose the aluminum. Next, high speed heating treatment is carried out with an infrared ray lamp, carbon strip heater or the like to instantly melt the aluminum at 500 to 600° C. for 10 to 30 seconds. Finally, the aluminum is gradually cooled so as to be monocrystallized with solid phase epitaxial growth method.

Meanwhile, according to a method disclosed in Japanese Laid-Open Patent Application No. 4-247625/1992 (Tokukaihei 4-247625), a polycrystal aluminum film having a thickness of 0.05 to 0.2 μm is formed with heating treatment using DMAH $((CH_3)_2AlH)$ as a material or with plasma CVD method on a silicon oxide film whose monocrystal silicon is partly exposed. As a result, a monocrystal aluminum film grows on the monocrystal silicon. Then, the polycrystal aluminum film is annealed at 500 to 600° C. Consequently, the polycrystal aluminum film is monocrystallized with the monocrystal aluminum film as a core. A monocrystal aluminum film is thus formed on the entire wafer surface.

Nevertheless, in the method disclosed in Japanese Laid-Open Patent Application No. 4-44229/1992, it would be difficult to form uniform monocrystal on the entire wafer surface with no seed crystal. Therefore, although gradual cooling alone could form aluminum crystal of a big grain diameter, the crystal formed in such a manner would have a polycrystal structure.

Moreover, according to the method disclosed in Japanese Laid-Open Patent Application No. 4-247625/1992, a silicon substrate is used as a seed crystal to monocrystallize the aluminum thereon. Therefor, the method needs the monocrystal silicon serving as the seed in the bed. Consequently, the method can not be widely applied. Specifically, for example, monocrystallization can not be carried out in second and third layers of multilayer wiring. Besides, if temperature varies on the wafer surface, or if there is an area on the wafer surface where heat radiation is locally inconsistent, it becomes very difficult to control the speed of gradual cooling and the temperature in the wafer surface. It is thus difficult to carry out monocrystallization on the entire wafer surface.

SUMMARY OF THE INVENTION

An object of the present invention is to offer a manufacturing method of wiring having a monocrystal structure, which requires no seed crystal to be prepared in a bed in advance and easily forms a seed crystal.

In order to accomplish the above object, a manufacturing method of wiring in accordance with the present invention has following processes: a polycrystal conductive film forming process, a heating process, and a gradual cooling process. The polycrystal conductive film forming process is a process of forming a polycrystal conductive film, surrounded by an insulating film, of a shape that is in accordance with a wiring pattern and includes one specific area where a ratio of a surface area to a volume is greater than that in the other area. The heating process is a process of heating the polycrystal conductive film to a temperature where the polycrystal conductive film has fluidity. The gradual cooling process is a process of gradually cooling the polycrystal conductive film down from that temperature so as to monocrystallize the polycrystal conductive film. The specific area is formed, for example, with patterning in a wedge-like shape or by making the corresponding area shallower than the other area.

With the above arrangement, the specific area has a better heat radiation effect than the other area in the polycrystal conductive film surrounded by the insulating film. Therefore, a first core is formed in the specific area while the polycrystal conductive film is being gradually cooled down after having being liquidized. Then, the same crystal grows with this core as a seed. This ensures monocrystallization of the whole polycrystal conductive film. Moreover, since no seed crystal is needed in the bed, for example, monocrystallization can be carried out even in second and third layers of multilayer wiring. As a result, the highly reliable super high density wiring and can be formed with a high yield.

Moreover, in the polycrystal conductive film forming process, the specific area is preferably formed to be of a wedge-like shape which is narrow on one end and wide on the other. This shape enables the specific area to be formed only by, for example, appropriately changing a wiring pattern in patterning of the polycrystal conductive film. Therefore, the polycrystal conductive film forming process is simplified compared with, for example, a case of a separate process set up for deepening the specific area. Note that an angle θ of the narrow end of the wedge-like area is preferably not more than 45°, and more particularly about 30°.

Meanwhile, in the polycrystal conductive film forming process, the area other than the specific area of the polycrystal conductive film is preferably formed to have no sharp corner. This allows the heat radiation effect to be better in the specific area than in the other area. Monocrystallization of the polycrystal conductive film is thus even more ensured.

Incidentally, the polycrystal conductive film forming process may be arranged in various manners. For example, the insulating film may be deposited after patterning the polycrystal conductive film. Nonetheless, more preferably, the polycrystal conductive film forming process is arranged so as to include following processes: a first process of forming on the insulating film a photoresist pattern of a shape in accordance with the shape of the polycrystal conductive film; a second process of forming a groove part on the insulating film with the photoresist pattern used as a mask so that the groove part has a depth in accordance with a thickness of the wiring; and a third process of embedding the polycrystal conductive film in the entire groove part. According to this arrangement, the polycrystal conductive film is embedded in the groove part formed as above. Therefore, the specific area can be formed even with a material, such as copper, which is so difficult to process elaborately that the wedge-like shape is hard to obtain. Besides, since the wiring material is embedded only in the groove part, it is passible to form flat wiring. Consequently, highly reliable wiring which does not receive stress from surroundings can be formed with a higher yield without depending upon elaborate metal processing.

Moreover, in the second process, the groove part is preferably formed with, for example, micro loading in etching so that an area corresponding to the specific area is shallower than the other area. This further improves the heat radiation effect in the specific area, compared with a case where the groove part does not vary in depth.

In addition, in a case where the groove part is formed, between the second and third processes, the polycrystal conductive film forming process preferably further includes a fourth process of forming, inside the groove part, a middle layer composed of a material that reacts in the third process with the polycrystal conductive film more easily than the insulating film does. When the polycrystal conductive film is composed of, for example, aluminum or an aluminum alloy, appropriate materials for the middle layer includes titanium and polycrystal silicon. With this arrangement, the polycrystal conductive film is embedded in the groove part with the middle layer sandwiched therebetween. Therefore, the polycrystal conductive film is easy to flow into the groove part compared with a case where the insulating film is exposed inside the groove part. Consequently, the polycrystal conductive film is more appropriately embedded in the groove part.

According to the manufacturing method of wiring in accordance with the present invention, the wiring having high reliability and super high density can be easily formed. Therefore, the manufacturing method of the wiring can be especially suitably used for a semiconductor device manufactured as an LSI (Large Scale Integration), such as a high speed device of submicron rule. This enables a super high density and high speed memory or logic of high reliability to be formed with a high yield.

For a fuller understanding of the nature and advantages of the invention, reference should be made to the ensuing detailed description taken in conjunction with the accompanying drawings.

BRIEF DESCRIPTION OF THE DRAWINGS

FIG. 2(*b*), showing the semiconductor device in the groove part forming process, is a cross-sectional view taken along line II—II shown in FIG. 2(*a*).

FIG. 3(*b*), showing the semiconductor device in the embedding process, is a cross-sectional view taken along line III—III shown in FIG. 3(*a*).

FIG. 4(*b*), showing the semiconductor device in the monocrystallization process, is a cross-sectional view taken along line IV—IV shown in FIG. 4(*a*).

DESCRIPTION OF THE EMBODIMENT

The following description will discuss manufacturing processes of a semiconductor device of an embodiment in accordance with the present invention. First, referring to FIGS. 1 through 6, the manufacturing processes of wiring constituting the semiconductor device will be discussed.

Figure 1:
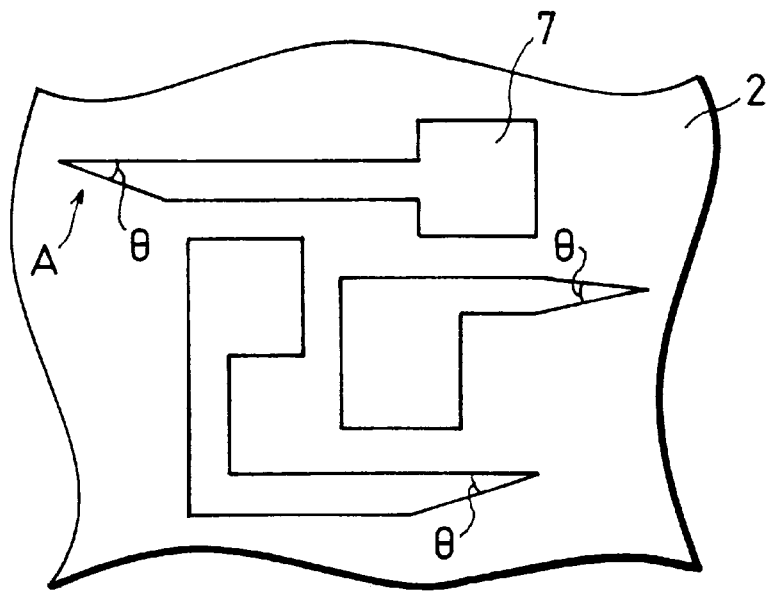
FIG. 1 is a plan view showing a photoresist pattern employed in a manufacturing process of a semiconductor device of an embodiment in accordance with the present invention.

As shown in FIG. 2(*b*), an insulating film 2 is provided on a silicon substrate 1. The insulating film 2 is about 10000 Å thick and made of, for example, a silicon oxide film. As shown in FIG. 1, a photoresist pattern 7 is provided on the insulating film 2 in accordance with a wiring pattern with an ordinary photolithography technique. Although the photoresist pattern 7 is provided using the wiring pattern and a reverse mask in the present embodiment, ordinary glass mask and negative resist may be used. An aperture is provided at a predetermined place of the silicon oxide film. An underlayer wiring layer (not shown) and the wiring pattern are connected with each other via the aperture.

The wiring pattern of the photoresist pattern 7 is provided so as to include in a closed wiring pattern only one wedge-like area A which is narrow on one end and wide on the other. Basically an angle θ on the narrower end of the wedge-like area A should small enough, compared with the rest of the closed system. In other words, the wedge-like area A should have a higher ratio of a surface area to a volume than the other area. Especially, the angle θ is preferably not greater than 45°: for example, the volume when θ=45° is equal to half the volume when θ=90°.

Basically, a smaller angle θ produces a larger surface area-to-volume ratio compared with the other area, and thus results in a better heat radiation effect. This causes a core to be more easily formed in monocrystallization and ensures growth of the monocrystal. On the other hand, it is not very preferable to make the angle θ of the wedge-like area A too small, because a small angle θ makes the wedge-like area A cover a large area in the layout, and thus increases the chip size. Therefore, in order to well balance the covered area and the effect, the angle θ is most preferably set to about 30°.

Figure 5:
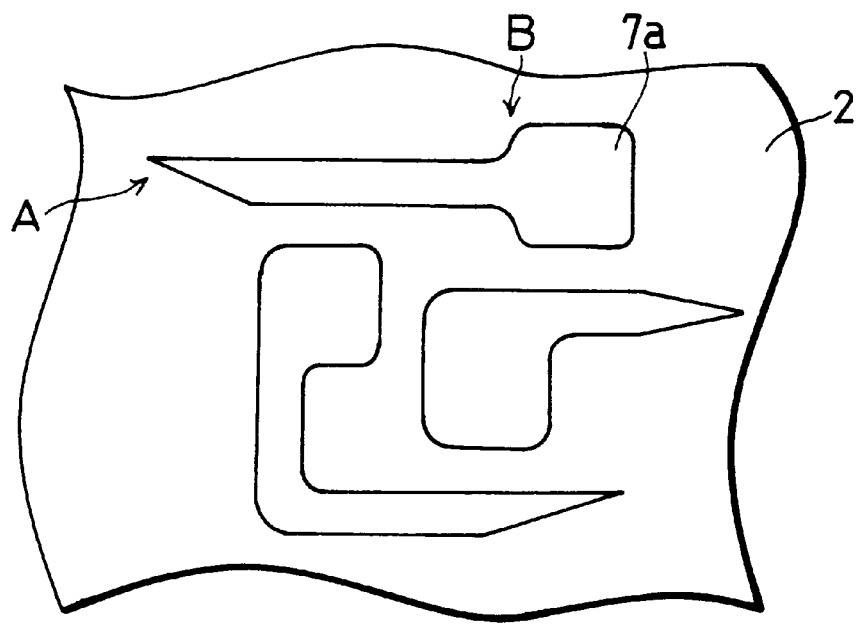
FIG. 5, showing a variation of the present invention, is a plan view showing a photoresist pattern employed in a manufacturing process of a semiconductor device.

Moreover, a wiring pattern area B outside the wedge-like area A is preferably formed with a photoresist pattern 7a shown in FIG. 5 so as to have round corners. This reduces the heat radiation effect of the pattern area B. Therefore, the difference between the heat radiation effect of the pattern area B and that of the wedge-like area A becomes greater, and therefore the monocrystal can be more reliably grown.

Next, the insulating film 2 is etched with RIE (Reactive Ion Etching) technique, using the photoresist pattern 7 as a mask, under conditions of, for example, $CHF_3/CF_4/Ar=60/60/120$ sccm, an output of 1000 W and a pressure of 250 mtorr. This amount, roughly 3000 to 10000 Å, should correspond to a thickness of the desired wiring. A groove part 3 of the wiring pattern having only one wedge-like area A is thus formed (see FIGS. 2(a) and 2(b)).

Figure 6:
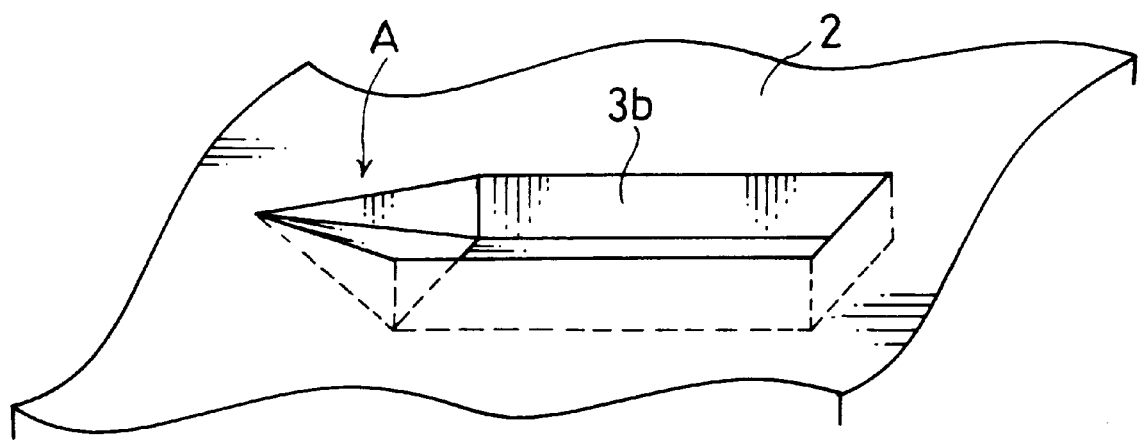
FIG. 6, showing another variation of the present invention, is a perspective view showing a groove part forming process, one of manufacturing processes of a semiconductor device.

Moreover, the groove part 3 is preferably formed to be shallower gradually near the narrower end of the wedge-like area A (see a groove part 3b shown in FIG. 6, for example). This shape is realized by controlling conditions in etching, and specifically, for example, by using micro loading in etching. More specifically, in a case of dry etching with $SiO_2$, deposit is produced when a ratio of flowing gas amount of $CHF_3+CF_4+Ar$ is set so that $CHF_3$ abounds than the other two, for example, so that $CHF_3$ accounts not less than 50%. Consequently, as the pattern becomes more complicated and intricate, etching rate becomes slower and finally comes to a complete halt. The groove part 3b, having the above shape, can be formed in this manner. As a result, the heat radiation effect of the wedge-like area A becomes even greater in the groove part 3b than in the groove part 3 which has a constant depth (see FIG. 2(a)).

Figure 3A:
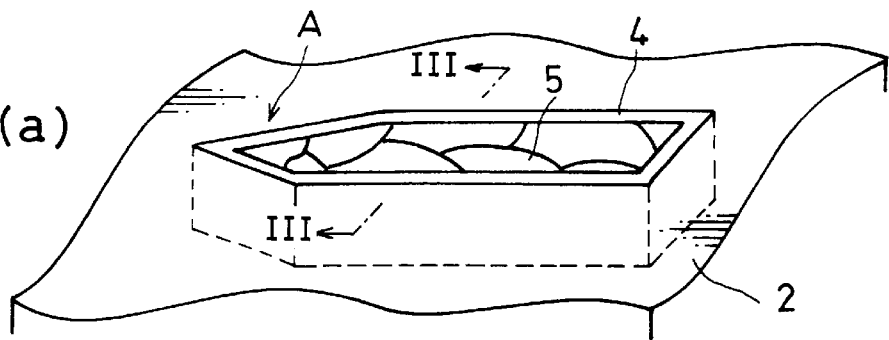
FIG. 3(*a*), a perspective view showing a manufacturing process of the semiconductor device, shows a process of embedding polycrystal aluminum in the groove part.
Figure 3B:
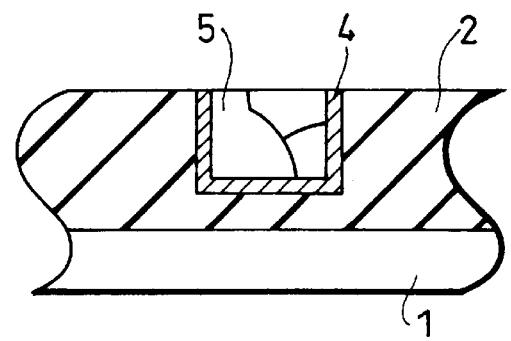
Figure 4A:
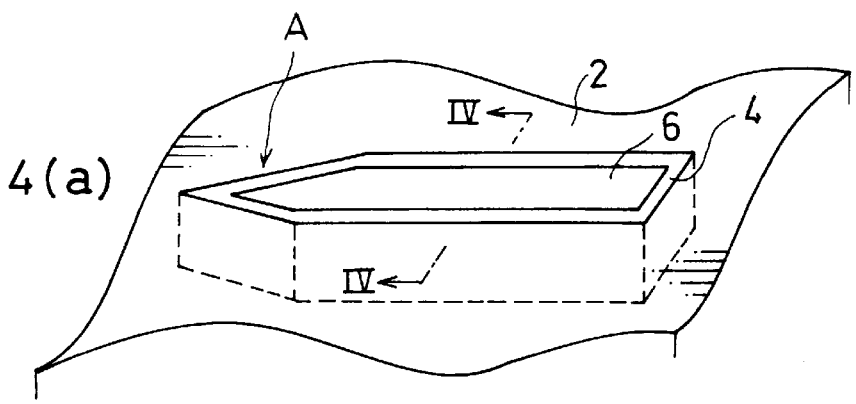
FIG. 4(*a*), a perspective view showing a manufacturing process of the semiconductor device, shows a process of monocrystallizing the polycrystal aluminum.
Figure 4B:
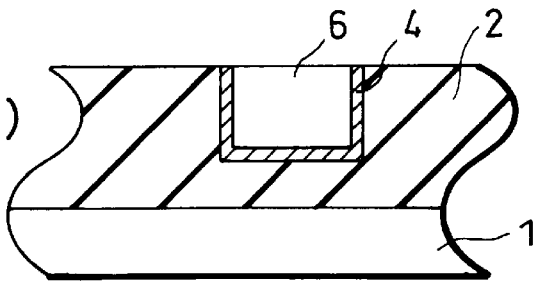

Next, as illustrated in FIGS. 3(a) and 3(b), a titanium (Ti) layer 4 of about 1000 Å is formed and then an aluminum layer 5 of about 5000 Å, a material for wiring, is formed on the titanium layer 4. Both layers are consecutively formed with DC magnetron sputtering method under vacuum. The titanium layer 4 has a characteristic of easily reacting with aluminum in low temperatures, which allows aluminum to easily flow into the groove part 3 and thus to be completely embedded in the groove part 3.

In the present embodiment, the titanium layer 4 is formed between the groove part 3 and the aluminum layer 5. Nonetheless, the material for a middle layer formed therebetween is not limited to titanium. Other materials may be also used as long as the material has a characteristic of easily reacting with aluminum in low temperatures, for example, polycrystal silicon.

Next, heat treatment is conducted for 1 to 10 minutes at 500 to 600° C. to melt the aluminum layer 5 and to embed the melted aluminum layer 5 in the wedge-like area A of the groove part 3 to the narrower end thereof. The aluminum layer 5 is thus embedded in the entire groove part 3. This heat treatment may be conducted in inert gas atmosphere, using an electric furnace or a lamp annealing device.

There are alternatives to the heat treatment. For example, the aluminum is first treated with sputtering while being heated up to 450 to 550° C., and then embedded in the groove part 3 to the narrower end thereof under a high pressure of 500 to 700 atm. Alternatively, the aluminum is embedded in the groove part 3 with CVD method using an organic source, such as DMAH (dimethyl aluminum hydride). A further example is to dissolve aluminum in a solvent, embed the dissolved aluminum with coating or spin coating method, and then remove the solvent with heat treatment.

Note that even after this aluminum embedding process, the aluminum layer 5 may have a polycrystal structure.

Next, the titanium layer 4 and the aluminum layer 5 which remain outside the groove part 3 are removed with etchback or CMP (Chemical Mechanical Polishing) method so that the titanium layer 4 and the aluminum layer 5 remain only in the groove part 3. The embedded wiring pattern is formed in this manner.

Next, monocrystallization is carried out by conducting again heat treatment at 500 to 600° C. for 1 to 10 minutes and then gradual cooling (for example, cooled down to about 150° C. at a ratio of 0.5 to 10° C. per minute and then naturally cooled down). This heat treatment is the same as the heat treatment previously mentioned. Since the heat radiation effect is large in the wedge-like area A of the aluminum layer 5, a core is first formed in the wedge-like area A (see FIGS. 4(a) and 4(b)). The same crystal grows with this core as a seed, which consequently leads to monocrystallization. Note that the temperature for the heat treatment is not limited to the above temperatures as long as the temperature allows the wiring material to have fluidity.

The heat treatment is conducted after the aluminum layer 5 is embedded in the groove part 3. Nevertheless, monocrystallized aluminum can also be obtained by embedding the aluminum layer 5 in the groove part 3 at a temperature close to the melting point of the aluminum and then cooling down gradually. An alternative is to form the titanium layer 4 and the aluminum layer 5, then conduct the monocrystallization, and remove the titanium layer 4 and the aluminum layer 5 which remain outside the groove part 3 with etchback or CMP method to expose the surface of the insulating film 2.

Although the discussion so far has been taking aluminum as an example, other metals and metal compounds may also be used. Nevertheless, if the melting point is high, affection to elements formed on the semiconductor substrate needs to be taken into consideration.

Figure 7:
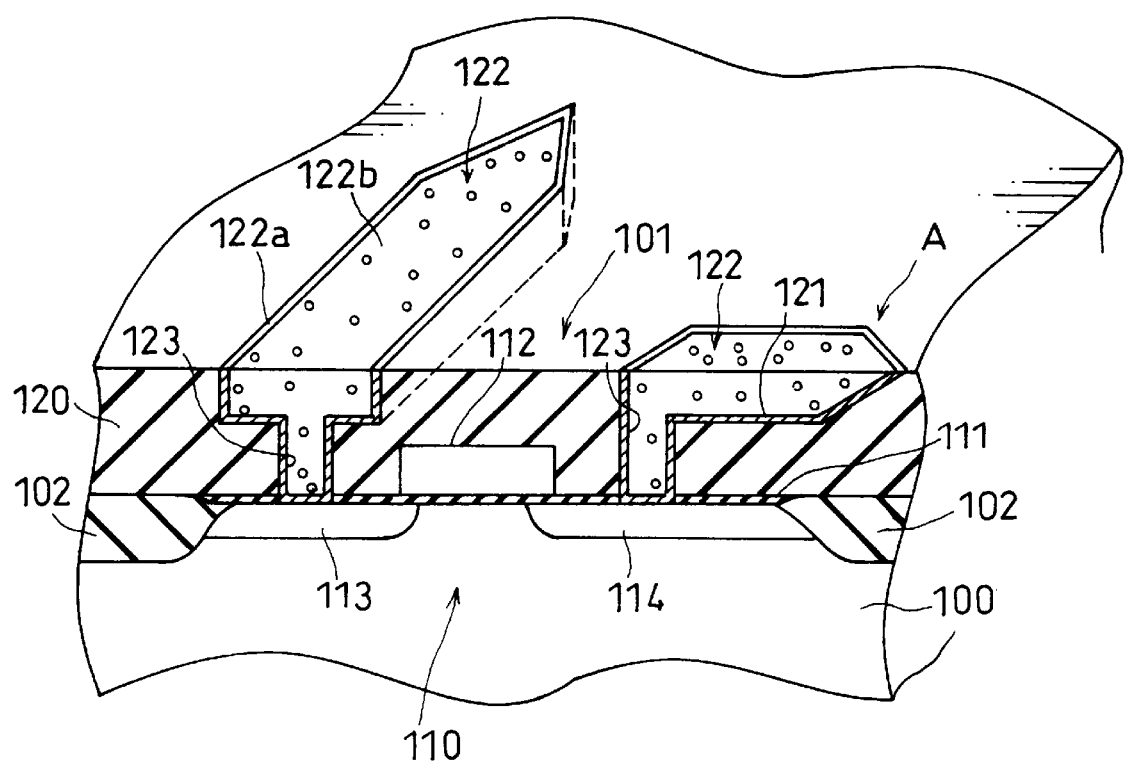
FIG. 7, showing a configuration of the whole semiconductor device, is a perspective view, partly in section.

Next, referring to FIG. 7, the following description will discuss a configuration of a whole MOSFET (Metal-Oxide-Semiconductor Field-Effect Transistor) as an example of semiconductor devices including the wiring manufactured according to the above manufacturing method.

That is, two element separation oxide films 102 are formed on a silicon substrate 100 in order to insulate an FET 101 from other circuit elements. The element separation oxide films 102 are formed with, for example, LOCOS (Local Oxidation of Silicon) method. Moreover, in the silicon substrate 100, a p⁻ type impurity such as boron is injected in a section between the element separation oxide films 102 which becomes a channel area 110 of the FET 101.

In addition, a gate oxide film 111 is formed on a surface of the silicon substrate 100 with deposit or growth. Then a gate electrode 112 of a desired shape is formed on the gate oxide film 111 with, for example, patterning after depositing polycrystal silicon. For example, an n$^+$ type impurity such as arsenic is introduced on the surface of the silicon substrate 100 on both sides of the gate electrode 112 with, for example, ion injection. In this manner, a source area 113 or a drain area 114 to which the n$^+$ type impurity is introduced are formed on the respective sides of the gate electrode 112. The impurity introduced to the areas 110, 113 and 114 is activated with, for example, anneal treatment. The FET 101 is thus formed.

Besides, an interlayer insulating film 120 is formed of, for example, a silicon oxide film on the surface of the silicon substrate 100 so as to cover the gate electrode 112, the source area 113 and the drain area 114. The interlayer insulating film 120 corresponds to the insulating film 2 shown in FIGS. 1 through 6.

Next, embedded wiring 122 composed of a titanium layer 122a and monocrystal aluminum 122b is formed on the interlayer insulating film 120 with the wiring manufacturing method illustrated in FIGS. 1 through 6 after a groove part 121 is formed. Note that titanium nitride may be formed on a surface of the titanium layer 122a by, for example, reacting with nitrogen atmosphere. Note also that a titanium nitride layer may be formed separately on the titanium layer 122a with reactive sputtering method. FIG. 7 shows a case of the manufacturing method shown in FIG. 6 being adopted as a manufacturing example. Therefore, the groove part 121 is configured so that the narrower end of the wedge-like area A is shallower than the other area.

Besides, before the embedded wiring 122 is formed, two contact holes 123 are formed at predetermined places of the interlayer insulating film 120 so as to pass through the interlayer insulating film 120 and the gate oxide film 111. Since the contact holes 123 and the groove part 121 are connected with each other, the corresponding embedded wiring 122 is connected to an underlayer of the interlayer insulating film 120. In FIG. 7, the contact holes 123 are provided at places corresponding to the source area 113 and the drain area 114. The embedded wiring 122 is connected to the respective corresponding areas 113 and 114 in this manner.

As described so far with reference to FIGS. 1 through 6, the manufacturing method of wiring in accordance with the present invention has following processes: a polycrystal conductive film forming process, a heating process, and a gradual cooling process. The polycrystal conductive film forming process is a process of forming a polycrystal conductive film, surrounded by an insulating film, of a shape that is in accordance with a wiring pattern and includes one specific area where a ratio of a surface area to a volume is greater than that in the other area. The heating process is a process of heating the polycrystal conductive film to a temperature where the polycrystal conductive film has fluidity. The gradual cooling process is a process of gradually cooling the polycrystal conductive film down from that temperature so as to monocrystallize the polycrystal conductive film. The specific area is formed, for example, with patterning in a wedge-like shape or by making the corresponding area shallower than the other area.

With the above arrangement, the specific area has a better heat radiation effect than the other area in the polycrystal conductive film surrounded by the insulating film. Therefore, a first core is formed in the specific area while the polycrystal conductive film is being gradually cooled down after having being liquidized. Then, the same crystal grows with this core as a seed. This ensures monocrystallization of the whole polycrystal conductive film.

According to a conventional method, a monocrystal serving as a seed is needed in advance in order to ensure monocrystallization of a desired polycrystal conductive film. Therefore, the conventional method can not be widely applied: for example, monocrystallization can not be carried out in second and third layers of multilayer wiring. Besides, a separate process is necessary for forming a seed crystal. On the other hand, if no seed crystal is formed, although crystals of large diameters may be formed, it is very difficult to carry out monocrystallization.

On the contrary, according to the present embodiment, monocrystallization of each polycrystal conductive film is ensured only by providing one specific area to the polycrystal conductive film. Therefore, monocrystallized complicated and intricate wiring can be easily formed. Moreover, since no seed crystal is needed in a bed, for example, monocrystallization can be carried out even in the second and third layers of the multilayer wiring. As a result, the highly reliable super high density wiring can be formed with a high yield.

Moreover, as illustrated in FIGS. 1 and 5, in the polycrystal conductive film forming process, the specific area is preferably formed to be of a wedge-like shape which is narrow on one end and wide on the other. This shape enables the specific area to be formed only by, for example, appropriately changing a wiring pattern in patterning of the polycrystal conductive film. Therefore, the polycrystal conductive film forming process is simplified compared with, for example, a case of a separate process set up for deepening the specific area. Note that an angle θ of the narrow end of the wedge-like area is preferably not more than 45°, and more particularly about 30°.

Meanwhile, as illustrated in FIG. 5, in the polycrystal conductive film forming process, the area other than the specific area of the polycrystal conductive film is preferably formed to have no sharp corner. This allows the heat radiation effect to be even better in the specific area than in the other area. Monocrystallization of the polycrystal conductive film is thus even more ensured.

Incidentally, the polycrystal conductive film forming process may be arranged in various manners. For example, the insulating film may be deposited after patterning the polycrystal conductive film. Nonetheless, more preferably, as illustrated in FIGS. 2(a) through 4(b), the polycrystal conductive film forming process is arranged so as to include following processes: a first process of forming on the insulating film a photoresist pattern of a shape in accordance with the shape of the polycrystal conductive film; a second process of forming a groove part on the insulating film with the photoresist pattern used as a mask so that the groove part has a depth in accordance with a thickness of the wiring; and a third process of embedding the polycrystal conductive film in the entire groove part. According to this arrangement, the polycrystal conductive film is embedded in the groove part formed as above. Therefore, the specific area can be formed even with a material, such as copper, which is so difficult to process elaborately that the wedge-like shape is hard to obtain. Besides, since the wiring material is embedded only in the groove part, it is possible to form flat wiring. Consequently, highly reliable wiring which does not receive stress from surroundings can be formed with a higher yield without depending upon elaborate metal processing.

In the present embodiment, the heat treatment is conducted after the polycrystal conductive film is embedded in the entire groove part. Nevertheless, there are alternatives. For example, in the third process, the polycrystal conductive film can be heated up to a temperature where the polycrystal conductive film has fluidity before being embedded in the entire groove part. In this case, the heat treatment in the third process and the heating process can be carried out as one process.

In addition, between the third and the heating processes, the present embodiment has the wiring forming process in which the wiring is formed by exposing the surface of the insulating film outside the groove part. Nonetheless, there are alternatives. The same effects as the present embodiment can be obtained by arranging the wiring forming process after the polycrystal conductive film is monocrystallized, that is, after the gradual cooling process.

Figure 2A:
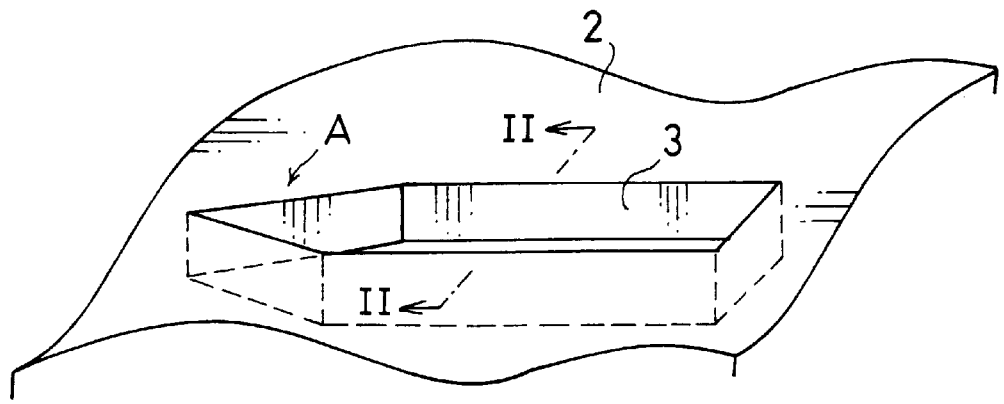
FIG. 2(*a*), a perspective view showing a manufacturing process of the semiconductor device, shows a process forming a groove part for forming wiring.
Figure 2B:
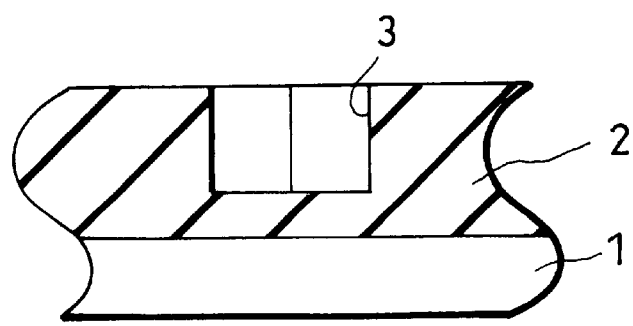

Moreover, as illustrated in FIG. 6, in the second process, the groove part is preferably formed with micro loading in etching so that an area corresponding to the specific area is shallower than the other area. This further improves the heat radiation effect in the specific area, compared with a case where the groove part does not vary in depth as illustrated in FIGS. 2(a) and 2(b).

In addition, in a case where the groove part is formed, as illustrated in FIGS. 3(a) and 3(b), the polycrystal conductive film forming process preferably further includes, between the second and third processes, a fourth process of forming, inside the groove part, a middle layer composed of a material that reacts in the third process with the polycrystal conductive film more easily than the insulating film does. When the polycrystal conductive film is composed of, for example, aluminum or an aluminum alloy, appropriate materials for the middle layer includes titanium and polycrystal silicon. With this arrangement, the polycrystal conductive film is embedded in the groove part with the middle layer sandwiched therebetween. Therefore, the polycrystal conductive film is easy to flow into the groove part compared with a case where the insulating film is exposed inside the groove part. Consequently, the polycrystal conductive film is more appropriately embedded in the groove part.

Note that in FIG. 7, an npn type FET is taken as an example of a device employing the wiring manufactured according to the above-mentioned manufacturing method. Nevertheless, this is not the only application. Needless to say, the above manufacturing method of wiring is also suitably employed for other semiconductor devices, such as a pnp type transistor and a diode. Besides, the above manufacturing method of wiring is also applicable to devices with no semiconductor, such as an FED (Field Emission Display) and a liquid crystal display device. According to the manufacturing method of wiring of the present embodiment, the highly reliable super high density wiring can be easily formed. Therefore, the manufacturing method of wiring can be especially suitably used for a semiconductor device manufactured as an LSI (Large Scale Integration), such as a high speed device of submicron rule. This enables a highly reliable memory or logic with a super high density and high speed to be formed with a high yield.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A manufacturing method of wiring, comprising the steps of:
   (a) forming a polycrystal conductive film in a closed wiring pattern having only one specific area of a wedge-like shape which is narrow on one end and wide on the other;
   (b) heating said polycrystal conductive film to a temperature where said polycrystal conductive film has fluidity; and
   (c) gradually cooling said polycrystal conductive film down so as to crystallize said heated polycrystal conductive film only in the specific area and thereafter monocrystallize the entirety of said polycrystal conductive film in the closed wiring pattern, using the crystallized specific area as a core.

2. The manufacturing method of wiring as defined in claim 1,
   wherein an angle $\theta$ of the narrow end of the wedge-like area satisfies the following condition:

$$0 < \theta \leq 45°$$

3. The manufacturing method of wiring as defined in claim 2,
   wherein the angle $\theta$ is about 30°.

4. The manufacturing method of wiring as defined in claim 1,
   wherein, in the step (a), the area other than the specific area of said polycrystal conductive film is formed to have no sharp corner.

5. The manufacturing method of wiring as defined in claim 2,
   wherein the step (a) includes the steps of:
   (1) forming on the insulating film a photoresist pattern of a shape in accordance with the shape of said polycrystal conductive film;
   (2) forming a groove part on the insulating film with the photoresist pattern used as a mask, the groove part having a depth in accordance with a thickness of the wiring; and
   (3) embedding said polycrystal conductive film in the entire groove part.

6. The manufacturing method of wiring as defined in claim 5,
   wherein, in the step (3), said polycrystal conductive film is embedded in the entire groove part by being heated up to a temperature where said polycrystal conductive film has fluidity.

7. The manufacturing method of wiring as defined in claim 5,
   wherein, in the step (2), the groove part is formed so that an area corresponding to the specific area is shallower than the other area.

8. The manufacturing method of wiring as defined in claim 7,
   wherein, in the step (2), the depth of the specific area is adjusted with micro loading in etching.

9. The manufacturing method of wiring as defined in claim 5,
   wherein, between the steps (2) and (3), the step (a) further includes the step of:
   (4) forming, inside the groove part, a middle layer composed of a material that reacts in the step (3) with the polycrystal conductive film more easily than the insulating film does.

10. The manufacturing method of wiring as defined in claim 9,
wherein said polycrystal conductive film is composed of either aluminum or an aluminum alloy, or both, and the middle layer is composed of titanium.

11. The manufacturing method of wiring as defined in claim 9,
wherein said polycrystal conductive film is composed of either aluminum or an aluminum alloy, or both, and the middle layer is composed of polycrystal silicon.

12. The manufacturing method of wiring as defined in claim 1,
wherein, said manufacturing method of wiring is used for manufacture of wiring of a semiconductor device.

13. The manufacturing method of wiring as defined in claim 1,
wherein, in the step (c), said polycrystal conductive film is gradually cooled down at such a cooling rate as to crystallize said heated polycrystal conductive film only in the specific area and to monocrystallize the entire part of said polycrystal conductive film, using the crystal as a core.

14. The manufacturing method of wiring as defined in claim 13, wherein, in the step (c), the cooling rate is specified between 0.5° C./min to 10° C./min.

* * * * *